United States Patent
Sitaram et al.

(10) Patent No.: US 6,958,501 B2
(45) Date of Patent: Oct. 25, 2005

(54) CONTACT-MAKING STRUCTURE FOR A FERROELECTRIC STORAGE CAPACITOR AND METHOD FOR FABRICATING THE STRUCTURE

(75) Inventors: Arkalgud Sitaram, Fishkill, NY (US); Christine Dehm, Nürnberg (DE); Carlos Mazuré-Espejo, St. Nazaire les Eymes (FR)

(73) Assignee: Infineon Technologies AG, Munich (DE)

(*) Notice: Subject to any disclaimer, the term of this patent is extended or adjusted under 35 U.S.C. 154(b) by 292 days.

(21) Appl. No.: 10/012,164

(22) Filed: Oct. 26, 2001

(65) Prior Publication Data

US 2002/0115227 A1 Aug. 22, 2002

(30) Foreign Application Priority Data

Oct. 26, 2000 (DE) .......................................... 100 53 172

(51) Int. Cl.$^7$ ................................................. H01L 29/76
(52) U.S. Cl. ........................................... 257/295; 438/3
(58) Field of Search ............................. 438/3, 396, 397, 438/398

(56) References Cited

U.S. PATENT DOCUMENTS

| | | | |
|---|---|---|---|
| 4,657,628 A | * | 4/1987 | Holloway et al. |
| 5,618,746 A | * | 4/1997 | Hwang |
| 6,107,136 A | * | 8/2000 | Melnick et al. |
| 6,455,424 B1 | * | 9/2002 | McTeer et al. |
| 6,498,094 B2 | * | 12/2002 | Nakao et al. |

FOREIGN PATENT DOCUMENTS

| | | |
|---|---|---|
| EP | 0 991 117 A2 | 4/2000 |
| WO | WO 00/14796 | 3/2000 |

OTHER PUBLICATIONS

Wolfgang Hönlein: "Neue Dielektrika für Gbit–Speicherchips" (New Dielectric for Gbit Memory Chips), Phys. B1. 55, No. 2, 1999, published by Wiley–VCH Verlag GmbH, pp. 51–53.

Shaohong Kuah et al.: Interaction of Ir and $IrO_2$ Thin Films with Polysilicon, W and $WSI_x$, *Integrated Ferroelectrics*, *1997*, vol. 17, pp. 479–488.

Yoon J. Song et al.: "A Novel Diffusion Barrier using Oxygen Stopping Layer for High Density FRAM", *Integrated Ferroelectrics*, 2000, vol. 31, pp. 351–358, XP008027687.

* cited by examiner

Primary Examiner—Nathan J. Flynn
Assistant Examiner—Kevin Quinto
(74) Attorney, Agent, or Firm—Laurence A. Greenberg; Werner H. Stemer; Ralph E. Locher

(57) ABSTRACT

A continuous contact hole is formed in an insulation layer that separates a storage capacitor from a switching transistor. All except a section of the contact hole is filled with poly-Si. A conductive, oxidizable interlayer and a conductive oxygen barrier layer are deposited on the Poly-Si in the remaining section of the contact hole such that the interlayer is completely surrounded by the poly-Si of the contact hole, the insulation layer, and the barrier layer.

13 Claims, 2 Drawing Sheets

CONTACT-MAKING STRUCTURE FOR A FERROELECTRIC STORAGE CAPACITOR AND METHOD FOR FABRICATING THE STRUCTURE

BACKGROUND OF THE INVENTION

Field of the Invention

The invention relates in general to the field of ferroelectric or paraelectric storage capacitors. In particular, the invention relates to a contact-making structure for a ferroelectric or paraelectric storage capacitor and to a method for fabricating the contact-making structure.

The dynamic semiconductor memory components (DRAMs) that are fabricated in microelectronics substantially include a select or switching transistor and a storage capacitor in which a dielectric material is fitted between two capacitor plates. Usually, oxide or nitride layers, which have a dielectric constant of at most approximately 8, are generally used as the dielectric. To reduce the size of the storage capacitor and to fabricate nonvolatile memories, "novel" capacitor materials, such as for example ferroelectric or paraelectric materials with significantly higher dielectric constants, are required. A few of these materials are mentioned in the publication "Neue Dielektrika für Gbit-Speicherchips" [New dielectrics for Gbit memory chips] by W. Hönlein, Phys. Bl. 55 (1999). By way of example, ferroelectric materials, such as $SrBi_2(Ta, Nb)_2O_9$ (SBT or SBTN), $Pb(Zr, Ti)O_3$ (PZT) or $Bi_4Ti_3O_{12}$ (BTO) can be used as the dielectric between the capacitor plates to fabricate ferroelectric capacitors for applications in nonvolatile semiconductor memory components with a high integration level. However, it is also possible to use a paraelectric material, such as for example $(BaSr)TiO_3$ (BST). Where the following text refers to ferroelectric materials, this term is also intended to equally encompass paraelectric materials.

The use of ferroelectric materials for storage capacitors imposes new demands on semiconductor process engineering. First, these new types of materials can no longer be combined with the traditional electrode material polysilicon. The reason for this is that, after the deposition of the ferroelectric material, it has to be heat-treated ("conditioned"), possibly a number of times, in an oxygen-containing atmosphere at temperatures of approximately 550–800° C. To avoid undesired chemical reactions between the ferroelectric material and the electrodes, it is necessary to use sufficiently temperature-stable and inert electrode materials, such as for example platinum metals, i.e. Pt, Pd, Ir, Rh, Ru or Os, the conductive oxides of these metals (e.g. $RuO_2$) or other conductive oxides, such as $LaSrCoOx$ or $SrRuO_3$.

FIG. 1 diagrammatically depicts a cross-sectional view through a conventional DRAM memory cell designed as a stacked cell. In this design of the memory cell, the switching transistor 2 and the storage capacitor 3 are arranged substantially directly above one another. The lower electrode 32 of the storage capacitor 3 is electrically connected to the drain region 21 of the MOS transistor 2 by a through-contact 41 that is filled with a plug 41a of electrically conductive material (e.g. polycrystalline silicon) and that has been etched through an insulation layer 4.

First, a MOS transistor 2 is fabricated on a semiconductor substrate 1 by forming a drain region 21 and a source region 23 by doping. There is a channel between the source 23 and drain 21 regions, the conductivity of which can be controlled by a gate 22 arranged above the channel. The gate 22 may be formed by or connected to a word line WL of the memory component. The source region 23 is connected to a bit line BL of the memory component. The MOS transistor 2 is then covered with a planarizing insulation layer 4, for example, an oxide, such as $SiO_2$. A storage capacitor 3 is formed on this insulation layer 4 by first applying a lower electrode 32 and patterning this electrode, which is then electrically connected to the drain region 21 of the MOS transistor 2 by the through-contact 41 that is filled with the plug 41a. Then, a metal-oxide-containing layer 33 of a ferroelectric material is deposited on the lower electrode 32, and this layer forms the capacitor material. An upper electrode 34 is deposited over the entire surface of this layer 33 and is patterned. Finally, the pattern obtained is in turn covered by a second planarizing insulation layer 5, for example, an oxide layer such as $SiO_2$, in which a further contact hole 51 is formed. The upper electrode 34 of the storage capacitor 3 can be connected to an external electrical connection P (common capacitor plate) by means of a suitable conductive material placed in the contact hole 51. The source region 23 of MOS transistor 2 is connected to the bit line BL as a result of forming a contact hole 52 that extends through both insulation layers 4 and 5 and filling the contact hole 52 with a conductive material, such as polycrystalline silicon.

FIGS. 2A and 2B show cross sections of conventionally fabricated contact-making structure. The through-contact 41 is only filled with the plug 41a up to a certain height, i.e. the conductive material is initially deposited into the through-contact 41 up to the edge of the latter, and then an upper region is etched away. Then, the inner wall of the section of the through-contact 41, which has been exposed in this way, is lined with a Ti or TiN layer 42. This layer 42 likewise covers a respective edge section on the surface of the insulation layer 4 on both sides of the through-contact 41. Then, an oxygen barrier layer 43, for example, including Ir or IrO is deposited on the Ti layer 42. This barrier layer 43 is intended to prevent oxygen from reaching the polycrystalline silicon and from forming an electrically insulating $SiO_2$ layer on the surface during the fabrication involving thermal oxidation or the like. Iridium (Ir) or iridium oxide (IrO) has the advantage that it can absorb oxygen without its electrical conductivity being significantly impaired. The Ti layer 42 below serves as a suitable transition layer, since on one hand it forms a low-resistance titanium silicide boundary layer with the polycrystalline silicon, and on the other hand, it forms a suitable nucleation layer for the Ir layer 43. The layers 42 and 43 may in principle also be formed from other materials which, however, must at least be electrically conductive, in order to produce electrical contact with the lower electrode layer 32 of the storage capacitor 3.

Generally, as shown in FIG. 2B, the sections of the layers 42 and 43 which extend laterally on edge sections of the through-contact 41 on the insulation layer 4 are removed by a CMP (Chemical Mechanical Polishing) process.

Then, the lower electrode layer 32, for example including Pt, is formed on this structure, and the ferroelectric layer 33, such as for example a SBT layer, is applied to this lower electrode layer 32. The subsequent heat-treatment step is carried out in an oxygen-containing atmosphere. This process is based on oxygen from the surrounding atmosphere penetrating into the SBT layer 33, where it is incorporated in the crystal lattice of the SBT layer 33. As mentioned in the introduction, this process requires a high process temperature and generally a relatively long treatment time. During this prolonged heat treatment time, the oxygen can also penetrate through the lower electrode layer 32. In this case, the oxygen which penetrates can oxidize the titanium material of the sections of the Ti layer 42 which are exposed at the top (circled sections in FIG. 2B), so that a thin insulating TiO layer is formed. Since titanium is very susceptible to oxidation, even relatively small quantities of oxygen may be sufficient for this TiO layer to form. However, this significantly impairs the electrical properties of the contact-making structure, since the through-contact is only electrically conductive over a reduced cross section.

SUMMARY OF THE INVENTION

It is accordingly an object of the invention to provide a contact-making structure for a ferroelectric storage capacitor and a method for fabricating the contact-making structure in which properties of the contact-making structure are not impaired by subsequent steps that are involved in processing the storage capacitor. In particular, the invention is based on protecting an oxidizable interlayer, which is used during the fabrication of the contact-making structure, from the penetration of oxygen.

The invention is substantially based on the fact that the oxidizable interlayer is completely surrounded by the insulation layer, the barrier layer, and the conductive material of the through-contact, as soon as the oxygen barrier layer has been deposited. In the direction of the through-contact, the interlayer adjoins the plug of conductive material which is located in the contact hole, while in the lateral direction the interlayer is surrounded by the insulation layer, and in the direction toward the memory capacitor which is to be formed, the interlayer is surrounded by the barrier layer. It is therefore surrounded by the oxygen barrier layer on those sections which, according to the conventional methods, it would only have been separated from the ferroelectric layer of the storage capacitor by the lower electrode layer. The result is that it is impossible for any oxygen to reach the interlayer, for example, during the heat-treatment step carried out on the ferroelectric layer.

With the foregoing and other objects in view there is provided, in accordance with the invention, a method for making a contact-making structure for making contact between a ferroelectric memory capacitor and a switching transistor. In a method step a), a through-contact is formed in an insulation layer, in a method step b), the through-contact is filled with a plug of electrically conductive material up to a height which is set back from the plane of the surface of the insulation layer, and finally, in a method step c), the conductive, oxidizable interlayer and a conductive oxygen barrier layer are deposited in the through-contact, and if appropriate, on an edge section on the insulation layer in such a manner that the interlayer is substantially completely surrounded by the plug, the insulation layer, and the barrier layer.

In accordance with an added mode of the invention, in the method step c), first the interlayer is deposited in such a manner that it covers the inner wall of the upper section, which is not filled with the conductive material, of the contact hole except for an upper encircling edge section, and then the barrier layer is deposited in the contact hole. In the latter case, the barrier layer may also initially be deposited in part on the surface of the insulation layer. It can be removed from there by a CMP process or can also be left there in order for the lower electrode layer of the storage capacitor to be subsequently deposited thereon.

In accordance with an additional mode of the invention, in method step c), the interlayer is initially deposited in such a way that it completely covers the inner wall of the upper, unfilled section of the contact hole, then a photoresist layer is introduced into the contact hole up to the height of the lower edge of the edge section which is intended to be kept clear. The section of the interlayer which is not covered by the photoresist layer is removed by an etching step, and then the photoresist layer is removed. However, other embodiments are also conceivable, in which the interlayer completely covers the inner wall of the unfilled section of the contact hole, and if appropriate, extends over part of the surface of the insulation layer. The barrier layer is then formed over the interlayer in such a way that it extends beyond the latter and covers any part of its surface which is still exposed.

As has already been described in connection with the prior art, the conductive material in the contact hole may be formed by doped polycrystalline silicon. The oxygen barrier layer used may be an Ir layer or an IrO layer or a double layer consisting of the two, and the interlayer used may be a Ti layer, a TiN layer or a Ti/TiN double layer. However, the invention is not restricted to these materials and can also be applied to other cases in which an oxidizable interlayer arranged between a barrier layer and the conductive material of a contact hole is to be protected from the penetration of oxygen.

With the foregoing and other objects in view there is provided, in accordance with the invention, a method for fabricating a memory component, such as a DRAM memory cell, which includes the contact-making structure, a switching transistor, and a storage capacitor. The method includes, first of all, forming a switching transistor on a substrate, such as a semiconductor substrate, applying an insulation layer to the switching transistor, providing the insulation layer with a contact-making structure using the method described above for fabricating such a contact-making structure, and finally forming a ferroelectric storage capacitor on the contact-making structure.

With the foregoing and other objects in view there is also provided, in accordance with the invention, a contact-making structure for making contact between a ferroelectric storage capacitor and a switching transistor located at opposite sides of an insulation layer. The contact-making structure includes an insulation layer having a through-contact formed therein, and the insulation layer has a surface. The through-contact includes a plug of electrically conductive material that is set back from the surface of the insulation layer. The contact-making structure includes a conductive, oxidizable interlayer and a conductive oxygen barrier layer that are deposited on the plug such that the interlayer is substantially completely surrounded by the plug, the insulation layer and the barrier layer.

With the foregoing and other objects in view there is also provided, in accordance with the invention, a memory component, that includes: a substrate; a switching transistor formed on the substrate; an insulation layer applied to the switching transistor; a contact-making structure formed in the insulation layer; and a storage capacitor formed on the contact-making structure. The insulation layer has a surface. The contact-making structure includes a plug of electrically conductive material that is set back from the surface of the insulation layer. The contact-making structure also includes a conductive, oxidizable interlayer and a conductive oxygen barrier layer that are deposited on the plug such that the interlayer is substantially completely surrounded by the plug, the insulation layer and the barrier layer.

Other features which are considered as characteristic for the invention are set forth in the appended claims.

Although the invention is illustrated and described herein as embodied in a contact-making structure for a ferroelectric storage capacitor, and method for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3A:
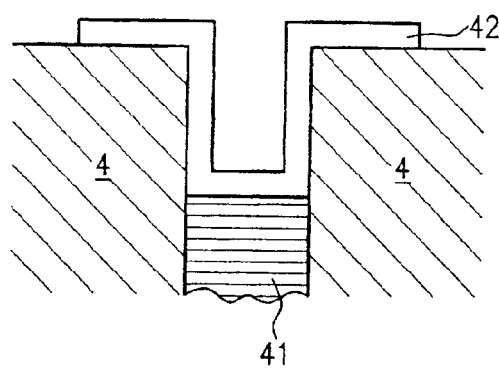
FIGS. 3A–3D illustrate an exemplary embodiment of a method for fabricating a contact-making structure.

Referring now to the figures of the drawing in detail and first, particularly, to FIG. 3A thereof, there is shown a cross section through an upper section of the contact hole 41 which has been formed in the insulation layer 4 and which has been filled up to a defined height with doped polycrystalline silicon. This is generally fabricated in such a way that the contact hole 41 is initially completely filled with polysilicon, and then the polysilicon is partly removed by performing an etching step. Then, a Ti, TiN or Ti/TiN double layer 42 is deposited, so that it lines the walls of the contact hole 41 in this upper section and covers an edge section on both sides of the contact hole 41 on the upper surface of the insulation layer 4.

Figure 3B:
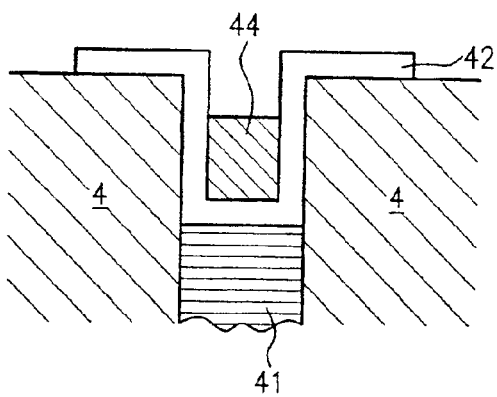

In accordance with FIG. 3B, the contact hole 41 is then filled up to a defined height with a photoresist layer 44. This photoresist layer 44 serves as a masking layer in a subsequent etching step for selectively removing the interlayer 42. In this etching step, those sections of the interlayer 42 which are not covered by the photoresist layer 44 are then removed.

Figure 3C:
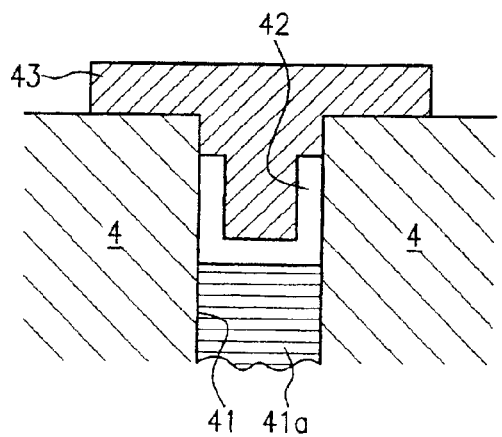

After the removal of these sections of the interlayer 42, an oxygen barrier layer 43 is then deposited in the contact hole and on a surface section of the insulation layer 4, as shown in FIG. 3C. This part of the barrier layer 43 which protrudes on the surface of the insulation layer 4 can then be removed by a CMP process, resulting in the structure shown in FIG. 3D.

Figure 1:
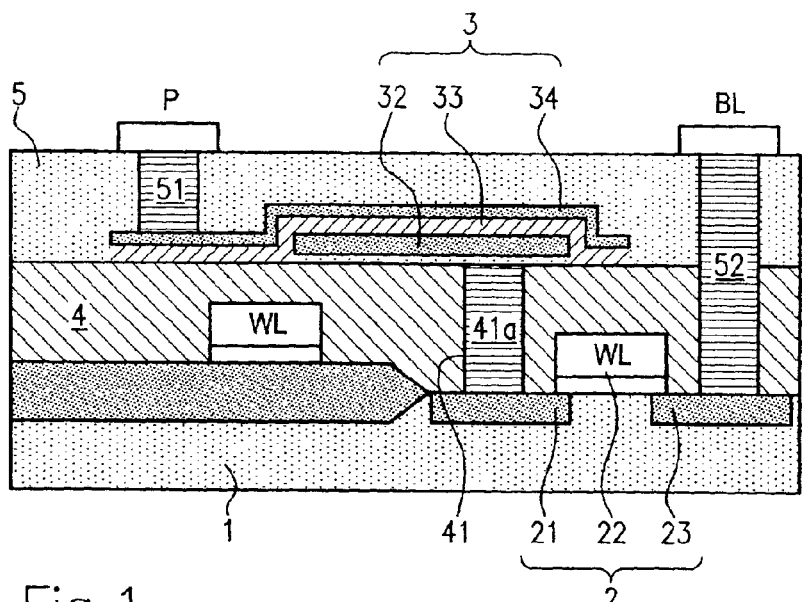
FIG. 1 shows a cross-sectional view through a prior art stacked DRAM memory cell.
Figure 2A:
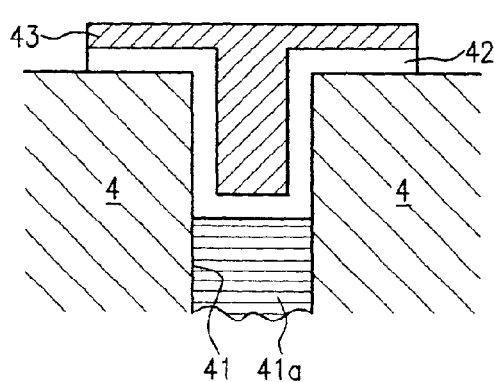
FIGS. 2A and 2B illustrate the fabrication of a prior art contact-making structure.
Figure 2B:
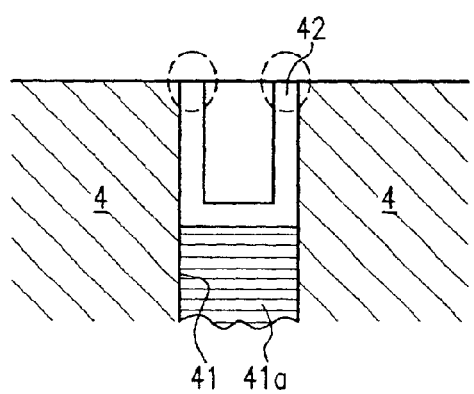
Figure 3D:
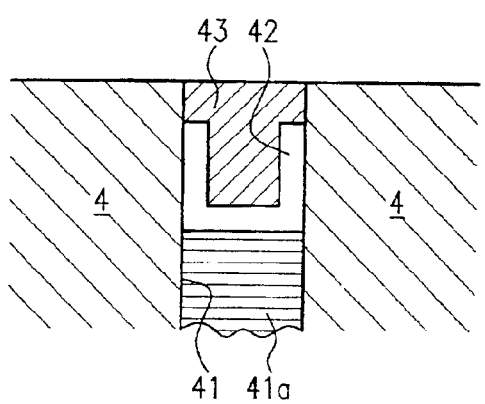

The advantage of the invention immediately becomes clear on comparing FIG. 3D with FIG. 2B. The interlayer 42 no longer extends as far as the surface of the structure, but rather is set back a certain distance into the structure. This distance is determined by the height of the photoresist layer 44 which is deposited in accordance with FIG. 3B. This distance effectively prevents oxygen atoms, which for example, diffuse into lower regions of the structure during a conditioning process that is carried out on the ferroelectric layer, from penetrating into the interlayer 42 and from forming electrically insulating oxide layers at its surface.

The exemplary embodiment illustrated has the advantage that the contact-making structure is embedded in the insulation layer 4 and forms a planarized surface with the surface of the insulation layer 4. This facilitates the subsequent formation of the memory capacitor on the contact-making structure.

In principle, however, it is also conceivable for the interlayer 42, starting from the structure shown in FIG. 3A, to be left in the form shown in that figure and for an oxygen barrier layer 43 to be deposited on this interlayer 42 in such a manner that it extends laterally beyond the interlayer 42. This also ensures that oxygen atoms can no longer reach the interlayer 42. This method may be easier to carry out, but has the drawback that the contact-making structure no longer lies flush in one plane with the surface of the insulation layer 4.

Then, a first lower electrode layer 32, which is formed, for example, from platinum, of the storage capacitor which is to be formed is deposited on the insulation layer 4 with the contact-making structure. A metal-oxide-containing layer 33 is deposited as the capacitor dielectric on the lower electrode layer 32, and this metal-oxide-containing layer 33, as described in the introduction, can then be subjected to a heat treatment in an oxygen-containing atmosphere without significantly damaging the interlayer 42 of the contact-making structure.

We claim:

1. A contact-making structure for making contact between a ferroelectric storage capacitor and a switching transistor located at opposite sides of an insulation layer, comprising:

an insulation layer having a through-contact formed therein and a surface, said through-contact including a plug formed of polycrystalline silicon and is set back from said surface of said insulation layer; and a conductive, oxidizable interlayer and a conductive oxygen barrier layer being deposited on said plug such that said interlayer is completely surrounded by said plug, said insulation layer and said barrier layer, said conductive oxygen barrier layer having an upper surface forming a planar surface with said surface of said insulation layer and completely filling in said through-contact.

2. The contact-making structure according to claim 1, wherein:

said through-contact has inner walls that are located above said plug; and said interlayer is formed along said inner walls of said through-contact that are located above said plug.

3. The contact-making structure according to claim 1, wherein said barrier layer includes a layer selected from the group consisting of an Ir layer and an IrO layer.

4. The contact-making structure according to claim 1, wherein said interlayer contains a layer selected from the group consisting of a Ti layer, a TiN layer and a Ti/TiN double layer.

5. The contact-making structure according to claim 4, wherein:

said through-contact has inner walls that are located above said plug; and said interlayer is formed along said inner walls of said through-contact that are located above said plug.

6. A memory component, comprising:

a substrate;

a switching transistor formed on said substrate;

an insulation layer applied to said switching transistor;

a contact-making structure formed in said insulation layer; and a storage capacitor formed on said contact-making structure;

said insulation layer having a surface;

said contact-making structure including a plug formed of polycrystalline silicon and is set back from said surface of said insulation layer; and said contact-making structure including a conductive, oxidizable interlayer and a conductive oxygen barrier layer that are deposited on said plug such that said interlayer is completely surrounded by said plug, said insulation layer and said barrier layer, said conductive oxygen barrier layer having an upper surface forming a planar surface with said surface of said insulation layer and completely filling in said contact-making structure.

7. A method for fabricating a contact-making structure used for making contact between a ferroelectric memory capacitor and a switching transistor located at opposite sides of an insulation layer, the method which comprises:

a) forming a contact hole in an insulation layer having a surface;

b) filling the contact hole with a plug of electrically conductive material up to a height that is set back from the surface of the insulation layer; and c) depositing a conductive, oxidizable interlayer to cover an inner wall of an upper, unfilled section of the contact hole except for an upper, encircling edge section and then depositing a conductive oxygen barrier layer in the contact hole such that the interlayer is completely surrounded by the plug, the insulation layer and the barrier layer, the conductive oxygen barrier layer having an upper surface forming a planar surface with the surface of the insulation layer and completely filling in the contact hole.

8. The method according to claim 7, wherein step c) includes depositing the interlayer and the barrier layer on an edge section of the insulation layer.

9. The method according to claim 7, wherein step c) includes:

initially depositing the interlayer to completely cover the inner wall; then introducing a photoresist layer into the contact hole up to a height of a lower edge of the edge section;

performing an etching step to remove a section of the interlayer that has not been covered by the photoresist layer; and then removing the photoresist layer.

10. The method according to claim 7, which comprises providing the interlayer with a layer selected from the group consisting of a Ti layer, a TiN layer and a Ti/Tin double layer.

11. The method according to claim 7, which comprises providing the barrier layer with a layer selected from the group consisting of an Ir layer and an IrO layer.

12. A method for fabricating a contact-making structure used for making contact between a ferroelectric memory capacitor and a switching transistor located at opposite sides of an insulation layer, the method which comprises:

a) forming a contact hole in an insulation layer having a surface;

b) filling the contact hole with a plug formed of polycrystalline silicon up to a height that is set back from the surface of the insulation layer; and c) depositing a conductive, oxidizable interlayer and a conductive oxygen barrier layer in the contact hole such that the interlayer is completely surrounded by the plug, the insulation layer and the barrier layer, the conductive oxygen barrier layer having an upper surface forming a planar surface with the surface of the insulation layer and completely filling in the contact hole.

13. A method for fabricating a memory component, which comprises:

forming a switching transistor on a substrate;

applying an insulation layer to the switching transistor, the insulation layer having a surface;

forming a contact-making structure on the insulation layer by performing the following steps:

a) forming a contact hole in the insulation layer, b) filling the contact hole with a plug formed of polycrystalline silicon up to a height that is set back from the surface of the insulation layer, and c) depositing a conductive, oxidizable interlayer and a conductive oxygen barrier layer in the contact hole such that the interlayer is completely surrounded by the plug, the insulation layer and the barrier layer, the conductive oxygen barrier layer having an upper surface forming a planar surface with the surface of the insulation layer and completely filling in the contact hole; and forming a storage capacitor, selected from the group consisting of a ferroelectric storage capacitor and a paraelectric storage capacitor, on the contact-making structure.

* * * * *